US011615741B2

(12) United States Patent
Shen et al.

(10) Patent No.: US 11,615,741 B2
(45) Date of Patent: Mar. 28, 2023

(54) METHODS AND APPARATUSES FOR DRIVING DISPLAY PANEL, AND DISPLAY DEVICES

(71) Applicant: KunShan Go-Visionox Opto-Electronics Co., Ltd., Kunshan (CN)

(72) Inventors: Zhihua Shen, Kunshan (CN); Lu Zhang, Kunshan (CN); Jianlong Wu, Kunshan (CN); Siming Hu, Kunshan (CN)

(73) Assignee: KunShan Go-Visionox Opto-Electronics Co., Ltd., Kunshan (CN)

( * ) Notice: Subject to any disclaimer, the term of this patent is extended or adjusted under 35 U.S.C. 154(b) by 0 days.

(21) Appl. No.: 17/327,991

(22) Filed: May 24, 2021

(65) Prior Publication Data

US 2021/0280128 A1 Sep. 9, 2021

Related U.S. Application Data

(63) Continuation of application No. PCT/CN2020/081026, filed on Mar. 25, 2020.

(30) Foreign Application Priority Data

Apr. 4, 2019 (CN) .......................... 201910272940.9

(51) Int. Cl.
*G09G 3/3225* (2016.01)
*G09G 3/3275* (2016.01)

(52) U.S. Cl.
CPC ......... *G09G 3/3225* (2013.01); *G09G 3/3275* (2013.01); *G09G 2340/16* (2013.01)

(58) Field of Classification Search
CPC . G09G 3/3225; G09G 3/3275; G09G 2340/16
See application file for complete search history.

(56) References Cited

U.S. PATENT DOCUMENTS

2011/0074753 A1* 3/2011 Yamamoto .......... H01L 27/3269
345/207
2013/0201176 A1 8/2013 Lee et al.
(Continued)

FOREIGN PATENT DOCUMENTS

| CN | 104122705 A | 10/2014 |
| CN | 104483794 A | 4/2015 |

(Continued)

OTHER PUBLICATIONS

Office Action and Search Report dated Jul. 1, 2020 in corresponding Chinese application No. 201910272940.9; 18 pages including Machine-generated English-language translation.

(Continued)

*Primary Examiner* — Michael A Faragalla
*Assistant Examiner* — Sujit Shah
(74) *Attorney, Agent, or Firm* — Maier & Maier, PLLC (57) ABSTRACT

A method and apparatus of driving a display panel, and a display device. The display panel includes a transparent display area and a non-transparent display area and a plurality of pixels formed on the display panel. In one or more embodiments, the method includes: determining a first type of picture data to be displayed in the non-transparent display area and a second type of picture data to be displayed in the transparent display area in picture data of a frame of picture; performing a sub-pixel rendering operation on the first type of picture data to obtain first rendered picture data; driving the non-transparent display area according to the first rendered picture data; and driving the transparent display area according to the second type of picture data.

19 Claims, 7 Drawing Sheets

(56) References Cited

U.S. PATENT DOCUMENTS

| | | | |
|---|---|---|---|
| 2017/0053972 A1 | 2/2017 | Kim et al. | |
| 2017/0076654 A1* | 3/2017 | Wang | G09G 3/2074 |
| 2017/0103696 A1* | 4/2017 | Li | G09G 3/2044 |
| 2017/0352128 A1 | 12/2017 | Sasao et al. | |
| 2018/0330137 A1 | 11/2018 | Moon | |
| 2019/0196635 A1* | 6/2019 | Park | G01S 17/04 |
| 2019/0237021 A1* | 8/2019 | Peng | G06F 3/14 |
| 2019/0310724 A1* | 10/2019 | Yeke Yazdandoost | G06V 40/1318 |
| 2020/0019747 A1 | 1/2020 | Yang et al. | |
| 2020/0328373 A1* | 10/2020 | Huang | H04M 1/0266 |

FOREIGN PATENT DOCUMENTS

| | | |
|---|---|---|
| CN | 106469748 A | 3/2017 |
| CN | 107194321 A | 9/2017 |
| CN | 207338380 U | 5/2018 |
| CN | 108269840 A | 7/2018 |
| CN | 108389879 A | 8/2018 |
| CN | 207947007 U | 10/2018 |
| CN | 108922900 A | 11/2018 |
| CN | 109036245 A | 12/2018 |
| CN | 208507679 U | 2/2019 |
| CN | 208607570 U | 3/2019 |
| CN | 109559650 A | 4/2019 |
| CN | 110767139 A | 2/2020 |
| CN | 110767159 A | 2/2020 |
| KR | 100727626 B1 | 6/2007 |

OTHER PUBLICATIONS

Office Action dated Sep. 15, 2020 in corresponding Chinese application No. 201910272940.9; 17 pages including Machine-generated English-language translation.

International Search Report dated Jul. 1, 2020 in corresponding International application No. PCT/CN2020/081026; 6 pages.

Notice of Rejection dated Nov. 19, 2020 in corresponding Chinese application No. 201910272940.9; 15 pages.

Written Opinion of the International Searching Authority dated Jul. 1, 2020 in corresponding International application No. PCT/CN2020/081026; 7 pages.

Notice of Reexamination dated Jul. 19, 2022 issued in Chinese Application No. 201910272940.9, 31 pages (Submitted with Machine/Partial Translation).

\* cited by examiner

METHODS AND APPARATUSES FOR DRIVING DISPLAY PANEL, AND DISPLAY DEVICES

CROSS-REFERENCE TO RELATED APPLICATIONS

This application a continuation application of International Patent Application No. PCT/CN2020/081026, filed on Mar. 25, 2020, which claims priority to Chinese Patent Application No. 201910272940.9 entitled "METHOD AND APPARATUS FOR DRIVING DISPLAY PANEL, AND DISPLAY DEVICE" and filed on Apr. 4, 2019, the entire contents of which are incorporated herein by reference.

TECHNICAL FIELD

The present disclosure relates to the field of OLED display devices, for example, to a method and apparatus of driving a display panel, and a display device.

BACKGROUND

With rapid development of display devices, users have increasingly higher requirements on screen-to-body ratio. Since the top of screen needs to be installed with components such as cameras, sensors and earpieces, a part of the top of screen is usually reserved for installing these components, for example, the "notch" area of iPhone X, which affects the overall consistency of the screen. At present, the full-screen display has attracted more and more attention from the industry.

SUMMARY

The present application provides a method of driving a display panel. The display panel includes a transparent display area and a non-transparent display area and a plurality of pixels formed on the display panel. The method includes:

determining a first type of picture data to be displayed in the non-transparent display area and a second type of picture data to be displayed in the transparent display area, in a plurality of picture data of a frame of picture;

performing a sub-pixel rendering operation on the first type of picture data to obtain a plurality of first rendered picture data;

driving the non-transparent display area according to the first rendered picture data; and driving the transparent display area according to the second type of picture data.

The present application provides an apparatus for driving a display panel. The display panel includes a transparent display area and a non-transparent display area, and the apparatus includes:

a determining circuit configured to determine a first type of picture data to be displayed in the non-transparent display area and a second type of picture data to be displayed in the transparent display area in a plurality of picture data of a frame of picture;

a processing circuit configured to perform a sub-pixel rendering operation on the first type of picture data to obtain a plurality of first rendered picture data; and a driving circuit configured to drive the non-transparent display area according to the first rendered picture data, and to drive the transparent display area according to the second type of picture data.

The present application provides a display device, including a display panel and the apparatus for driving a display panel as described above. The display panel includes a transparent display area and a non-transparent display area.

Optionally, the display panel includes an OLED array substrate and an encapsulation layer, the encapsulation layer is encapsulated on a side of the OLED array substrate away from a base of the OLED array substrate, and a photosensitive element is arranged below the transparent display area.

Optionally, at least a part of the transparent display area is surrounded by the non-transparent display area.

Optionally, the encapsulation layer includes a polarizer, and the polarizer covers the non-transparent display area and does not cover the transparent display area.

Optionally, the photosensitive element includes at least one of the following: a camera, a light sensor, or a light emitter.

By determining the first type of picture data to be displayed in the non-transparent display area and the second type of picture data to be displayed in the transparent display area in the picture data of the same frame of picture, then performing the sub-pixel rendering operation on the first type of picture data to obtain the first rendered picture data, driving the non-transparent display area according to the first rendered picture data and driving the transparent display area according to the second type of picture data, the display resolution of an picture displayed in the non-transparent display area can be increased, and the quality thereof can be also improved.

It should be understood that the above general description and the following detailed description are only exemplary and explanatory, and cannot limit the present application.

DETAILED DESCRIPTION OF THE EMBODIMENTS

The technical solutions in the embodiments of the present application will be clearly and completely described below with reference to the drawings in the embodiments of the present application. Obviously, the described embodiments are part of the embodiments of the present application, rather than all of them. Based on the embodiments in this application, all other embodiments obtained by those skilled in the art without creative work shall fall within the claimed scope of this application.

There exists a type of display panel that includes a non-transparent display area and a transparent display area. The transparent display area can achieve both light transmission function and display function. Photosensitive elements such as cameras and distance sensors are arranged below the transparent display area. Since an arrangement of pixels in the transparent display area is different from that in the non-transparent display area, how to drive the display panel according to picture data of a same frame of picture is a technical problem to be solved.

Figure 1:
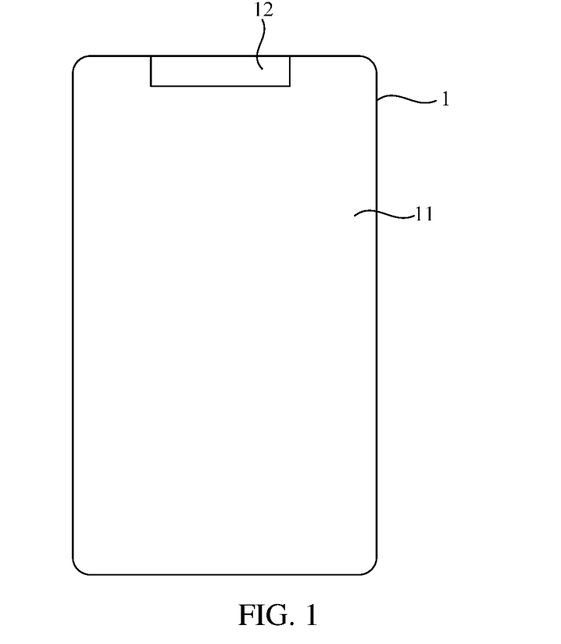
FIG. 1 is a schematic structural diagram illustrating a display panel according to the present application.
Figure 2:
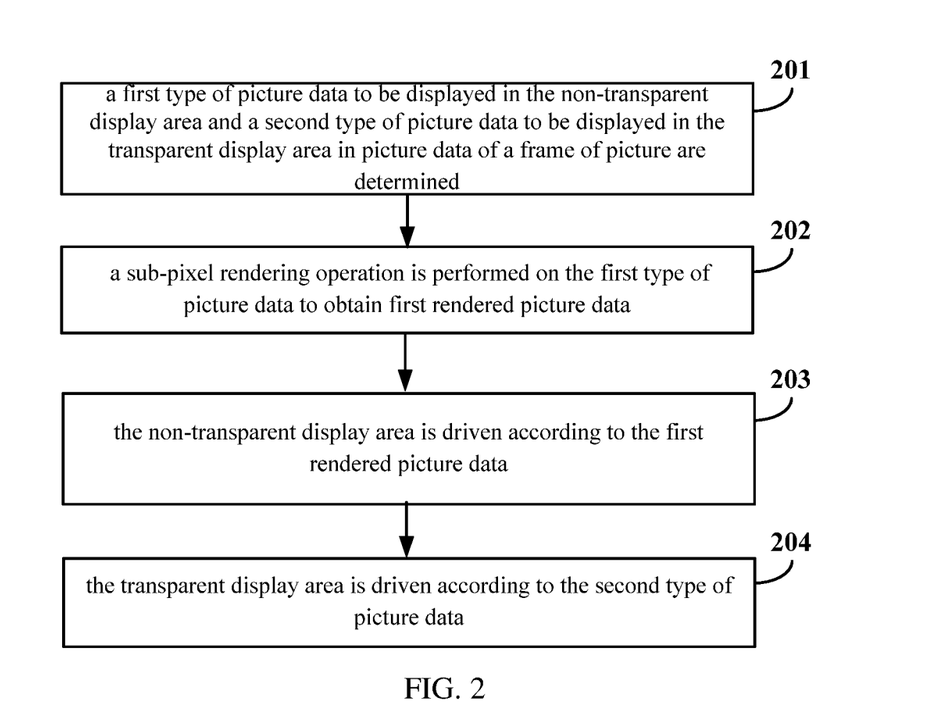
FIG. 2 is a flowchart illustrating a method of driving a display panel according to the present application.

In view of the above technical problem, the present disclosure provides a method of driving a display panel. As shown in FIG. 1, the display panel 1 includes a transparent display area 12 and a non-transparent display area 11 and a plurality of pixels formed on the display panel. As shown in FIG. 2, the driving method includes the following steps 201 to 204:

At step 201, a first type of picture data to be displayed in the non-transparent display area and a second type of picture data to be displayed in the transparent display area in a plurality of picture data of a frame of picture are determined.

The picture data of the same frame can include the first type of picture data and the second type of picture data. The first type of picture data is used to drive the non-transparent display area to display, and the second type of picture data is used to drive the transparent display area to display.

Figure 3:
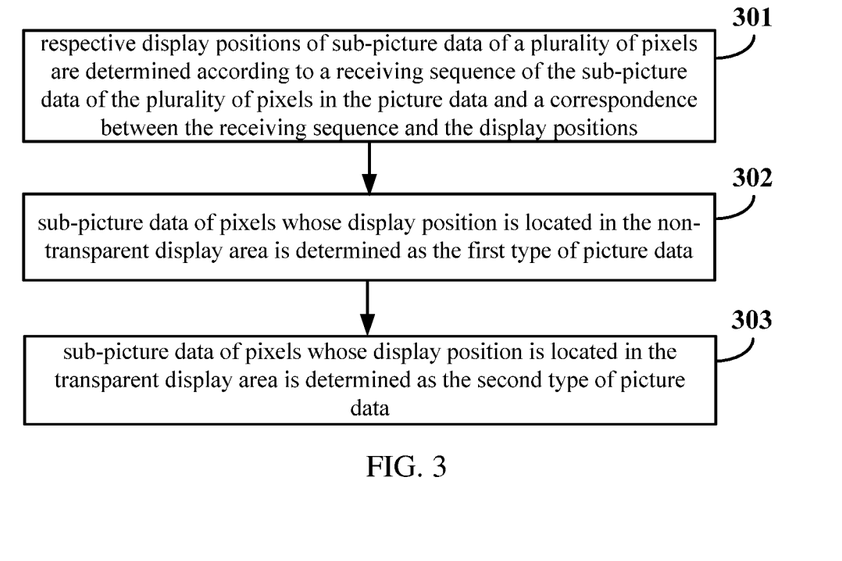
FIG. 3 is a flowchart illustrating a method of driving a display panel according to the present application.

Optionally, step 201 may include the following steps 301 to 303:

At step 301, respective display positions of a plurality of sub-picture data of a plurality of pixels are determined according to a receiving sequence of the sub-picture data of the plurality of pixels in the picture data and a correspondence of the receiving sequence and the display positions.

At step 302, sub-picture data whose display positions are located in the non-transparent display area is determined as the first type of picture data.

At step 303, sub-picture data whose display positions are located in the transparent display area is determined as the second type of picture data.

Optionally, picture data of a frame of picture includes sub-picture data of a plurality of rows of pixels, and the display panel receives sub-picture data of one row of pixels at a time. Sub-picture data of each row of pixels is used to drive one row of pixels at a specified position on the display panel to display. For example, sub-picture data of pixels in a fifth row received by the display panel is used to drive the pixels in the fifth row on the display panel to display. Therefore, the display panel can determine the display position of the sub-picture data of each of the plurality of pixels according to the receiving sequence of the sub-picture data of each pixel in the picture data and a pre-stored correspondence between the receiving sequence and the display positions. Then, the display panel may determine the sub-picture data whose display positions are located in the non-transparent display area as the first type of picture data, and determine the sub-picture data whose display positions are located in the transparent display area as the second type of picture data. The execution sequence of step 302 and step 303 is not limited to the aforementioned execution sequence.

The respective display positions of the sub-picture data of the plurality of pixels are determined according to the receiving sequence of the sub-picture data of each pixel in the picture data and the correspondence between the receiving sequence and the display positions, which is easy to implement and needs less computation.

At step 202, a sub-pixel rendering operation is performed on the first type of picture data to obtain a plurality of first rendered picture data.

At step 203, the non-transparent display area is driven according to the first rendered picture data.

At step 204, the transparent display area is driven according to the second type of picture data.

For ease of understanding, Sub Pixel Rendering (SPR) will be briefly introduced below. When the picture data of a frame of picture includes sub-picture data of 1920 rows and 720 columns of pixels, if a display resolution of 1920*1080 is desired, sub-picture data of (1080−720=360) columns of pixels can be obtained by calculation. For example, the method for calculating the sub-picture data of one column and 1920 rows of pixels includes: obtaining the sub-picture data of one column and 1920 rows of pixels by calculating according to sub-picture data of adjacent T rows and adjacent T columns of pixels, and then, inserting the sub-picture data of one column and 1920 rows of pixels into the sub-picture data of the adjacent T rows and adjacent T columns of pixels to drive the display panel to display, thereby improving the display resolution, where T is a natural number greater than 1.

Optionally, in order to increase the display resolution of the non-transparent display area, the sub-pixel rendering operation may be performed on the first type of picture data to obtain first rendered picture data, and the non-transparent display area is driven according to the first rendered picture data. In this way, the display resolution of the non-transparent display area when displaying a picture can be increased, and the picture display quality thereof can be also improved.

Optionally, before step 204, the sub-pixel rendering operation may not be performed on the second type of picture data. Before the transparent display area is driven according to the second type of picture data, no sub-pixel rendering operation is performed on the second type of picture data, which can reduce the difficulty in picture processing. Please refer to the following contents for the structure of the transparent display area.

Figure 4:
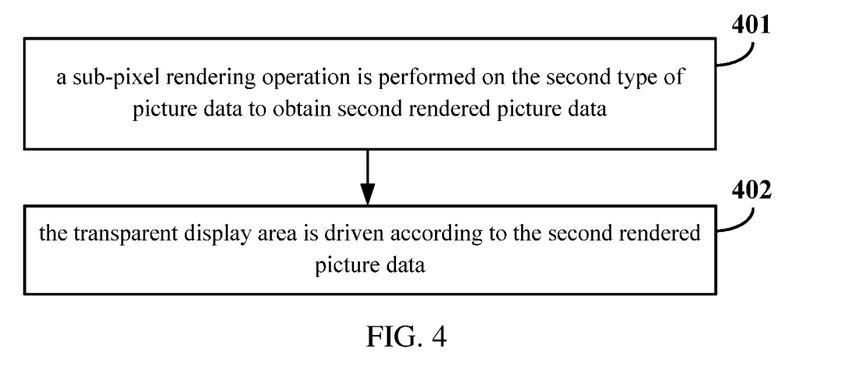
FIG. 4 is a flowchart illustrating a method of driving a display panel according to the present application.

Optionally, as shown in FIG. 4, in addition to the method of driving the display panel shown in FIG. 2, this embodiment further includes the following steps 401 to 402:

At step 401, a sub-pixel rendering operation is performed on the second type of picture data to obtain second rendered picture data.

At step 402, the transparent display area is driven according to the second rendered picture data.

Optionally, performing the sub-pixel rendering operation on the second type of picture data to obtain the second rendered picture data, and driving the transparent display area according to the second rendered picture data can increase the display resolution of the transparent display area when displaying a picture, and also improve the picture display quality thereof.

Figure 5:
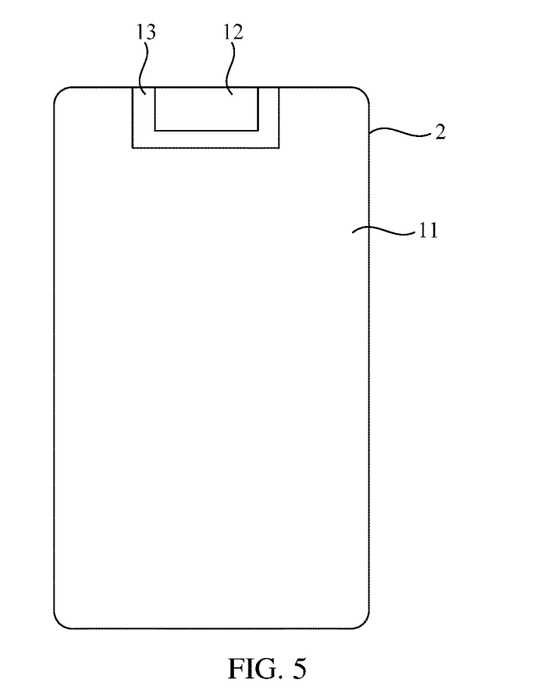
FIG. 5 is a schematic structural diagram illustrating a display panel according to the present application.
Figure 6:
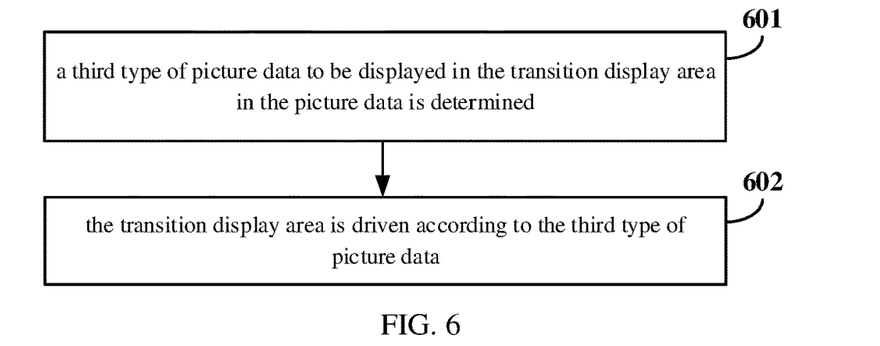
FIG. 6 is a flowchart illustrating a method of driving a display panel according to the present application.

Optionally, as shown in FIG. 5, in this embodiment, based on the method of driving the display panel shown in FIG. 2, the display panel 2 further includes a transition display area 13. The transition display area 13 is located between the transparent display area 12 and the non-transparent display area 11. Optionally, as shown in FIG. 6, the driving method includes the following steps 601 to 602:

At step 601, a third type of picture data in the picture data and to be displayed in the transition display area is determined;

At step 602, the transition display area is driven according to the third type of picture data.

Optionally, by determining the third type of picture data in the picture data and displayed in the transition display area, and driving the transition display area according to the third type of picture data, the display can be implemented according to the structure of the display panel so as to improve the display quality.

Optionally, the method of determining the third type of picture data in the picture data and displayed in the transition display area is similar to the above-mentioned method of determining the first type of picture data and the second type of picture data.

Optionally, before step 602, the sub-pixel rendering operation may not be performed on the third type of picture data. In this way, the difficulty in picture processing can be reduced.

Figure 7:
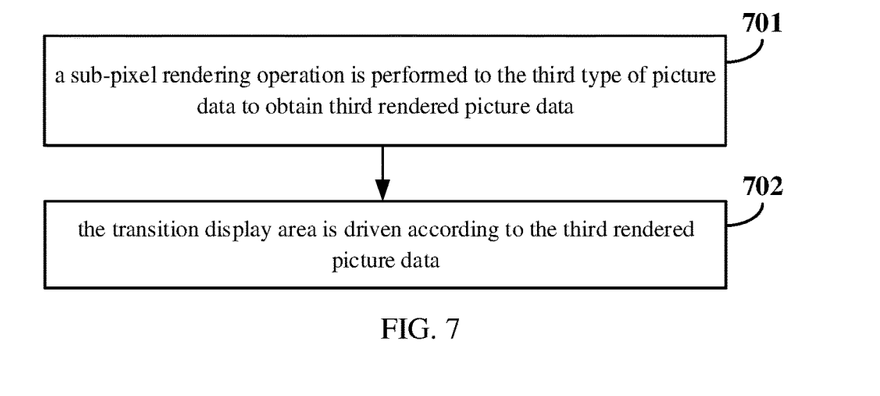
FIG. 7 is a flowchart illustrating a method of driving a display panel according to the present application.

Optionally, as shown in FIG. 7, in this embodiment, based on the method of driving the display panel shown in FIG. 6, step 602 includes the following steps 701 to 702:

At step 701, a sub-pixel rendering operation is performed on the third type of picture data to obtain third rendered picture data.

At step 702, the transition display area is driven according to the third rendered picture data.

Optionally, by performing the sub-pixel rendering operation on the third type of picture data to obtain the third rendered picture data, and driving the transition display area according to the third rendered picture data, the display resolution of the transition display area when displaying a picture is increased, and the picture display quality thereof is also improved.

Figure 8:
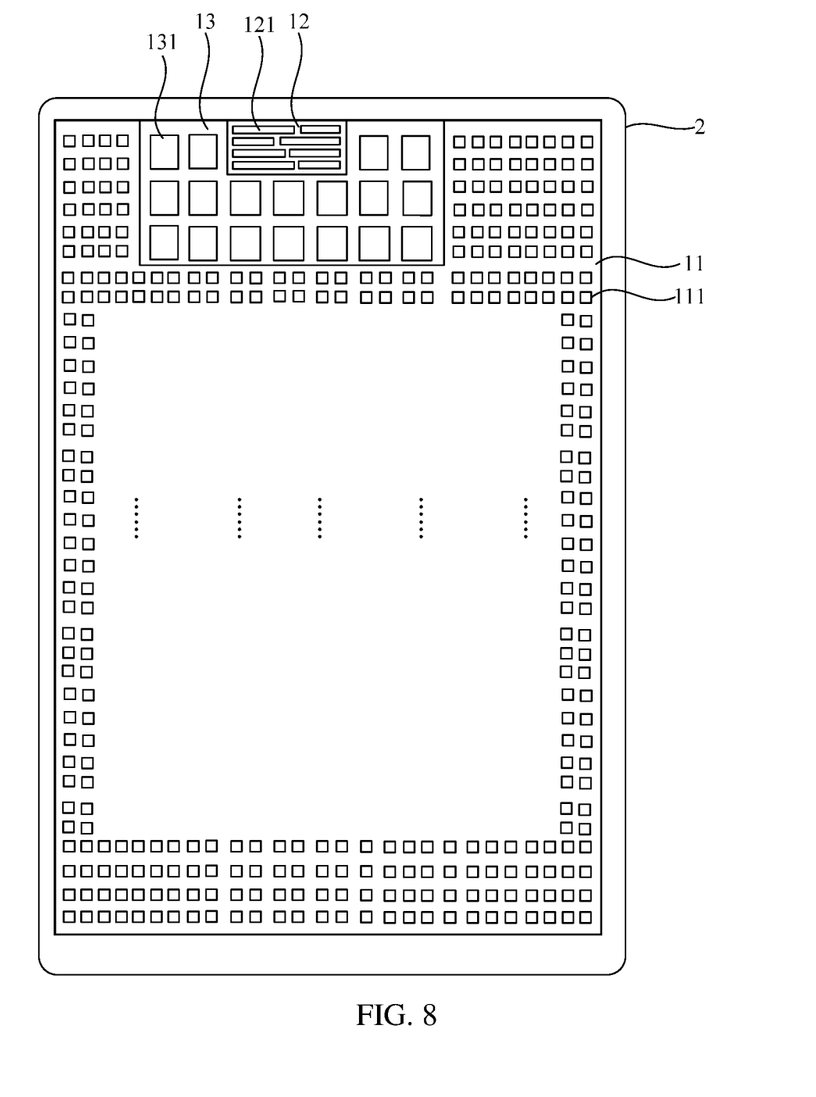
FIG. 8 is a schematic structural diagram illustrating a display panel according to the present application.

Optionally, as shown in FIG. 8, the non-transparent display area 11 includes a plurality of first OLED pixels 111 arranged in an array; the transition display area 13 includes a plurality of second OLED pixels 131 arranged in an array. A pixel density of the plurality of second OLED pixels 131 is less than a pixel density of the plurality of first OLED pixels 111, that is, a pixel density of the transition display area 13 is smaller than a pixel density of the non-transparent display area 11.

Figure 9:
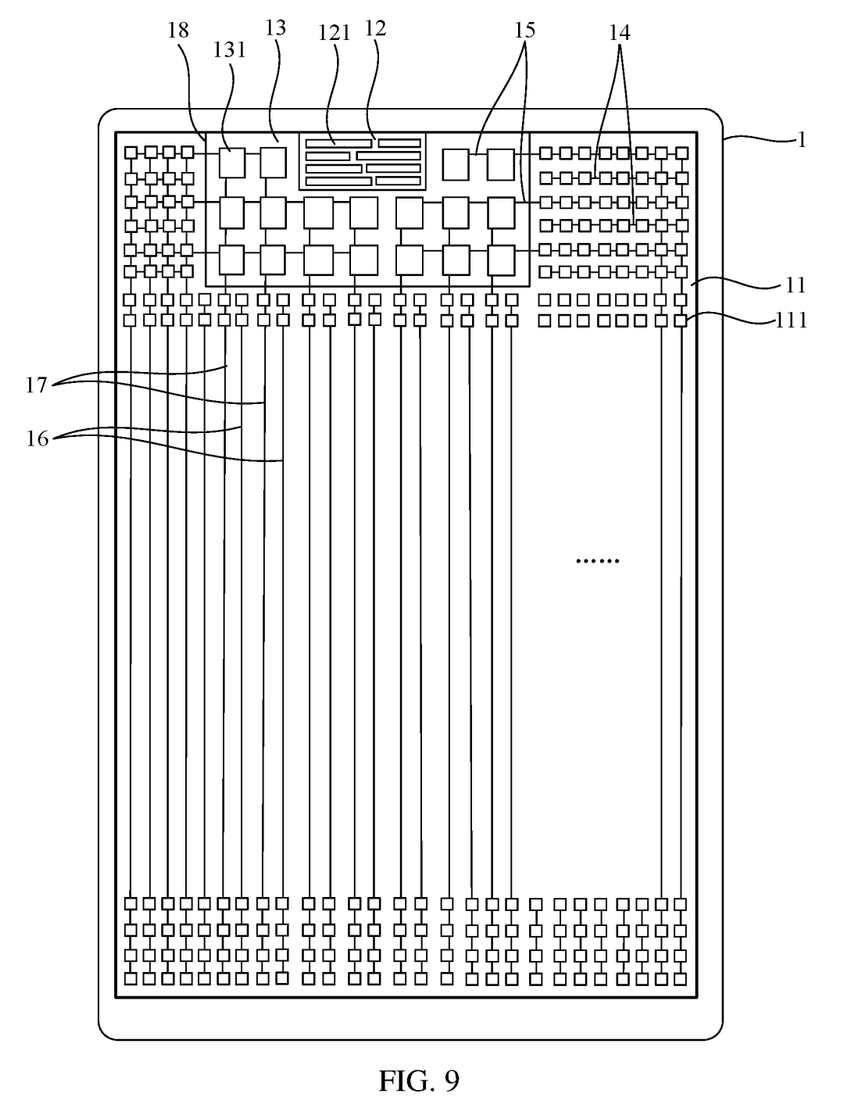
FIG. 9 is a schematic structural diagram illustrating a display panel according to the present application.

As shown in FIG. 9, a same row of the second OLED pixels 131 and one row of first OLED pixels in adjacent M rows of the first OLED pixels 111 share a same scanning line 15. At least one scanning line 14 of the first OLED pixels 111 is disposed between two scanning lines 15 of two adjacent rows of the second OLED pixels 131. A same column of the second OLED pixels 131 and one column of first OLED pixels in M columns of the first OLED pixels 111 share a same data line 17. At least one data line 16 of the first OLED pixels 111 is disposed between two data lines 17 of two adjacent columns of the second OLED pixels 131, where M is a natural number.

The scanning line 15 of the second OLED pixels 131 refers to a scanning line shared by the second OLED pixels 131 and the first OLED pixels 111, and the scanning line 14 of the first OLED pixels 111 refers to a scanning line connecting only the first OLED pixels 111. The data line 17 of the second OLED pixels 131 refers to a data line shared by the second OLED pixels 131 and the first OLED pixels 111, and the data line 16 of the first OLED pixels 111 refers to a data line connecting only the first OLED pixels 111.

The second OLED pixels 131 in a same row and one row of first OLED pixies in adjacent M rows of first OLED pixels 111 share a same scanning line 15. Two scanning lines 15 of two adjacent rows of the second OLED pixels 131 have at least one scanning line 14 of the first OLED pixels 111 disposed therebetween. The second OLED pixels 131 in a same column and one column of first OLED pixels in M columns of first OLED pixels 111 share a same data line 17, and two data lines 17 of two adjacent columns of the second OLED pixels 131 have at least one data line 16 of the first OLED pixels 111 disposed therebetween. Therefore, at least one row of the third rendered picture data between two rows of third rendered picture data displayed by two adjacent rows of the second OLED pixels is not displayed; and at least one column of the third rendered picture data between two columns of the third rendered picture data displayed by two adjacent columns of the second OLED pixels is not displayed. In the transition display area, two adjacent rows of the second OLED pixels are used to display two rows of the third rendered picture data. At least one row of third rendered picture data between the two rows of the third rendered picture data is not displayed. Two adjacent columns of the second OLED pixels are used to display two columns of the third rendered picture data. At least one column of third rendered picture data between the two columns of the third rendered picture data is not displayed. In this way, when the sub-pixel rendering operation is performed on the third type of picture data, picture data of one pixel in the third type of picture data affects only picture data of one pixel in the third rendered picture data, so that the picture data of adjacent pixels in the third rendered picture data will not be affected by crosstalk, and the difficulty in picture processing is reduced.

Figure 10:
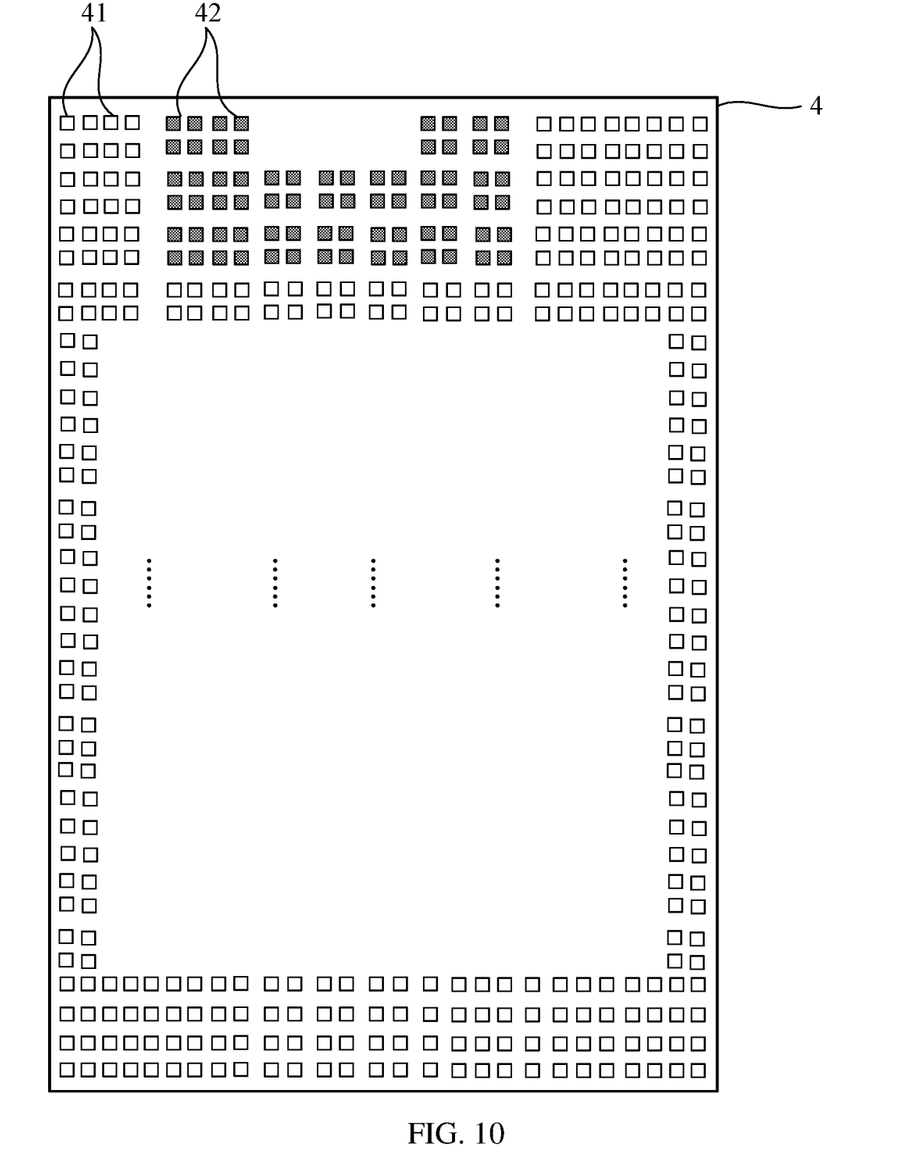
FIG. 10 is a schematic diagram illustrating picture data of a frame of picture after a sub-pixel rendering operation according to the present application.

For example, as shown in FIG. 10, picture data 4 of a frame of picture after the sub-pixel rendering operation may include first rendered picture data 41 and third rendered picture data 42. The first rendered picture data 41 is picture data displayed in the non-transparent display area 11, and the third rendered picture data 42 is picture data displayed in the transition display area 13. The relationship between pixels in the non-transparent display area 11 and the transition display area 13 and picture data in the picture data 4 of a frame of picture is as follows:

In the non-transparent display area 11, two adjacent rows of first OLED pixels 111 are used to display two adjacent rows of the first rendered picture data 41, and two adjacent columns of the first OLED pixels 111 are used to display two adjacent columns of the first rendered picture data 41. For example, the seventh row of the first OLED pixels 111 is used to display the seventh row of the first rendered picture data 41, the eighth row of the first OLED pixels 111 is used to display the eighth row of the first rendered picture data 41, the first column of the first OLED pixels 111 is used to display the first column of first rendered picture data 41, and the second column of first OLED pixels 111 is used to display the second column of the first rendered picture data 41.

In the transition display area 13, two adjacent rows of the second OLED pixels 131 are used to display two rows of the third rendered picture data 42, and at least one row of third rendered picture data between the two rows of the third rendered picture data 42 is not displayed. Two adjacent columns of the second OLED pixels 131 are used to display two columns of the third rendered picture data 42, and at least one column of third rendered picture data between the two columns of the third rendered picture data 42 is not displayed. For example, the second row of the second OLED pixels 131 is used to sequentially display the first column, the third column, the fifth column, the seventh column, the ninth column, the eleventh column, etc. of the third rendered picture data 42 in the third rendered picture data 42 of the third row, and the third row of the second OLED pixels 131 is used to sequentially display the first column, the third column, the fifth column, the seventh column, the ninth column, the eleventh column, etc. of the third rendered picture data 42 in the third rendered picture data 42 of the fifth row. That is, the second OLED pixels 131 in the transition display area 13 are used to display the third rendered picture data 42 of alternate rows and columns.

Optionally, the above-mentioned display panel includes an OLED array substrate and an encapsulation layer. The encapsulation layer is encapsulated on a side of the OLED array substrate away from a base of the OLED array substrate. The encapsulation layer includes a polarizer, which covers the non-transparent display area 11 and a part of the transition display area 13, and does not cover the transparent display area 12. Since a part of the second OLED pixels 131 in the transition display area 13 is covered by the polarizer, and the other part of the second OLED pixels 131 is not covered by the polarizer, the display effect of the transition display area is poor. Therefore, in order to improve the display effect of the transition display area, the light emitting brightness of the second OLED pixels 131 not covered by the polarizer may be lowered. A solution for reducing the light emitting brightness of the second OLED pixels 131 not covered by the polarizer is to adjust picture data of an original picture, for example, to adjust a third type of picture data in the picture data of the original picture. The above-mentioned picture data 4 is obtained after the sub-pixel rendering operation is performed on the picture data of the original picture. However, when obtaining the third rendered picture data by performing the sub-pixel rendering operation on the third type of picture data, adjusting the sub-picture data of one pixel in the third type of picture data will affect the picture data of two pixels in the third rendered picture data. Therefore, the difficulty in picture processing in the transition display area will be increased.

Figure 11:
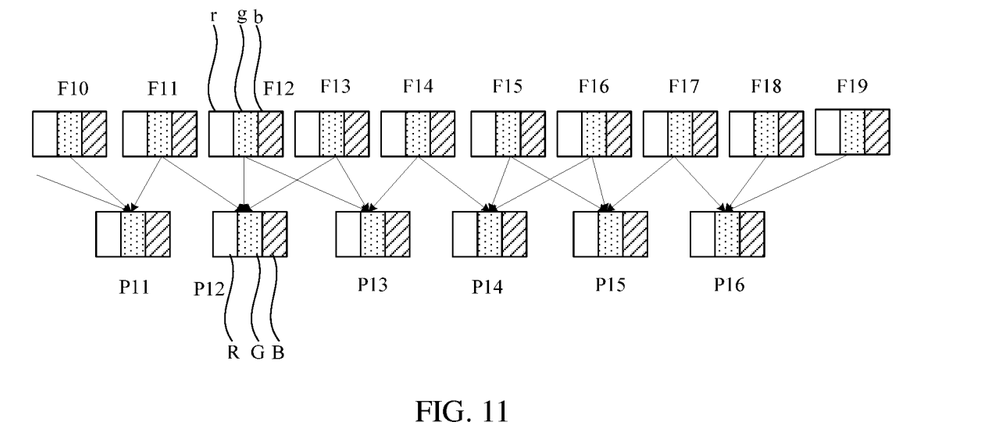
FIG. 11 is a schematic diagram illustrating a method of a sub-pixel rendering operation according to the present application.

For ease of understanding, the SPR operation in a row direction will be briefly described below. As shown in FIG. 11, picture data F10 to F19 are sub-picture data of pixels in the first row of a frame of original picture data. In the picture data F10 to F19, sub-picture data of each pixel includes a grayscale value of a red sub-pixel r, a grayscale value of a green sub-pixel g, and a grayscale value of a blue sub-pixel b. Picture data P11 to P16 are the picture data of pixels in the first row of the picture data 4 of the above-mentioned picture to be displayed. In the picture data P11 to P16, the picture data of each pixel includes a brightness value of a red sub-pixel R, a brightness value of a green sub-pixel G, and a brightness value of a blue sub-pixel B. It can be seen from FIG. 11 that, when the SPR operation is used to process the original picture data, the picture data P12 is determined by the picture data F11, F12, and F13, and the picture data P13 is determined by the picture data F12, F13, and F14. The picture data F12 in the original picture data affects both the picture data P12 and the picture data P13. Therefore, the difficulty in picture processing is larger.

Figure 12:
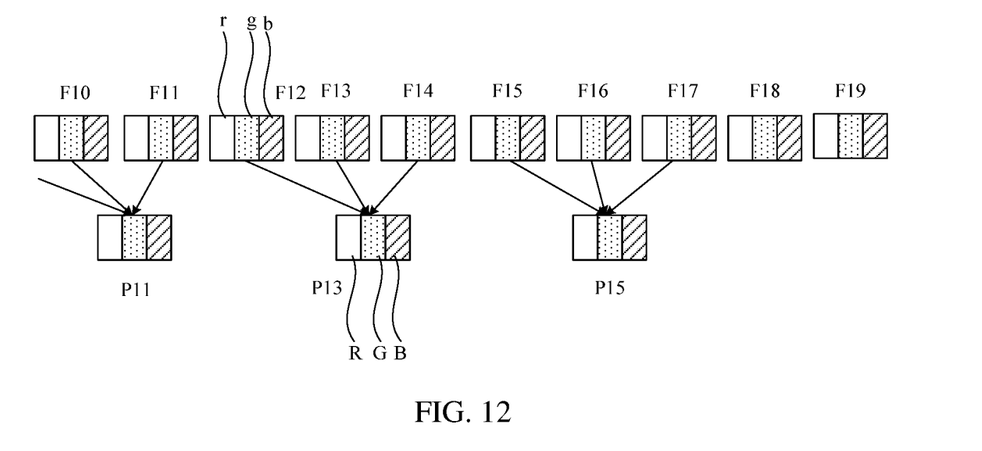
FIG. 12 is a schematic diagram illustrating a display in alternate columns according to the present application.

As shown in FIG. 12, in the picture data of the first row of pixels of the picture data 4, when the picture data P12, P14, and P16 are not used to display, and the picture data P11, P13, and P15 are used to drive three adjacent pixels in a same row of pixels to display, it is unnecessary to consider whether the picture data P12, P14, and P16 will be affected, and only picture data of which pixels in the original picture data will affect the picture data P11, P13, and P15 is to be considered. It can be seen from FIG. 12 that, in the picture data of the first row of pixels of the picture data 4, the picture data P13 is determined by F12, F13, and F14, and the picture data P15 is determined by F15, F16, and F17, that is, the picture data of one pixel in the original picture data affects only the picture data of one pixel actually displayed in the picture data 4. In this way, the picture data of adjacent pixels is not affected by crosstalk, which can reduce the difficulty in picture processing.

Optionally, as shown in FIG. 9, M is equal to 2, an $n^{th}$ row of the second OLED pixels 131 and a $2n-1^{th}$ row of the first OLED pixels 111 share the same scanning line 15, and an $m^{th}$ column of the second OLED pixels 131 and a $2m-1^{th}$ column of first OLED pixels 111 share the same data line 17, where n is a natural number and m is a natural number. When M is equal to 2, the transition display area can display picture data of alternate rows and columns, a position of a pixel row where one row of the second OLED pixels is located may be substantially opposite to positions of pixel rows where two adjacent rows of the first OLED pixels are located, and a position of a pixel column where one column of the second OLED pixels is located may be substantially opposite to positions of pixel columns where two adjacent columns of the first OLED pixels are located. In this way, it is possible to avoid the excessive area of a single second OLED pixel that cause the resolution of the transition display area to be significantly reduced.

Optionally, a pixel area of the second OLED pixels 131 may be larger than a pixel area of the first OLED pixels 111. Since the pixel area of the second OLED pixels is larger than the pixel area of the first OLED pixels, by increasing the pixel area of the second OLED pixels, a pixel density of the second OLED pixels can be smaller than a pixel density of the first OLED pixels, and a gap between adjacent second OLED pixels in the transition display area can be reduced so as to avoid the display quality of picture from being affected.

Optionally, the pixel area of the second OLED pixels 131 may be N times the pixel area of the first OLED pixels 111, where N may be a real number greater than or equal to 4. For example, N can be 4, 4.1, 4.25, and so on. Since the pixel area of the second OLED pixels is greater than or equal to 4 times the pixel area of the first OLED pixels, the position of the pixel row where one row of the second OLED pixels is located can be substantially opposite to the positions of the pixel rows where two adjacent rows of the first OLED pixels are located, and the position of the pixel column where one column of the second OLED pixels is located can be substantially opposite to the positions of the pixel columns where two columns of the first OLED pixels are located. In this way, it is possible to avoid that the pixel area of a single second OLED pixel is too small to display transition display area in alternate rows and columns.

Optionally, each of the first OLED pixels 111 may include sub-pixels of K colors, where K is a natural number. Since each of the first OLED pixels may include the sub-pixels of K colors, the non-transparent display area may display a corresponding picture using the sub-pixels of K colors. For example, when K is equal to 1, the non-transparent display area can display a monochrome picture, and when K is equal to 3, the non-transparent display area can display a colorful picture. Optionally, K is equal to 3.

Optionally, when K is equal to 3, one first OLED pixel includes a red sub-pixel, a green sub-pixel, and a blue sub-pixel. When each one of the first OLED pixels includes the red sub-pixel, the green sub-pixel, and the blue sub-pixel, the non-transparent display area can display a colorful picture.

Optionally, in one first OLED pixel, the red sub-pixel, the green sub-pixel, and the blue sub-pixel may be arranged side by side. In the non-transparent display area, when the red sub-pixel, the green sub-pixel, and the blue sub-pixel in the first OLED pixel are arranged side by side, the manufacturing difficulty can be reduced.

Optionally, in one first OLED pixel, the red sub-pixel, the green sub-pixel, and the blue sub-pixel are distributed in a triangle. In the non-transparent display area, when the red sub-pixel, the green sub-pixel, and the blue sub-pixel in the first OLED pixel are distributed in a triangle, the manufacturing difficulty can be reduced.

Optionally, each of the second OLED pixels 131 may include sub-pixels of W colors, where W is a natural number. Since each of the second OLED pixels may include the sub-pixels of W colors, the transition display area may display a corresponding picture using the sub-pixels of W colors. For example, when W is 1, the transition display area can display a monochrome picture, and when W is 3, the transition display area can display a colorful picture. Optionally, W is 3.

Optionally, when W is 3, one second OLED pixel includes a red sub-pixel, a green sub-pixel, and a blue sub-pixel. When each one of the second OLED pixels includes the red sub-pixel, the green sub-pixel, and the blue sub-pixel, the transition display area can display a colorful picture.

Optionally, in one second OLED pixel, the red sub-pixel, the green sub-pixel, and the blue sub-pixel are arranged side by side or distributed in a triangle, which can reduce the manufacturing difficulty.

Optionally, the transparent display area may have any of the following shapes: rectangle, diamond, water drop, circle, ellipse, semicircle, or semiellipse.

Optionally, the shape of the transparent display area is rectangular, a length of the transparent display area is 3 mm, and a width of the transparent display area is 3 mm Since the shape of the transparent display area is rectangular, which is regular, the manufacturing difficulty can be reduced.

Optionally, as shown in FIG. 8, the transparent display area 12 may include a plurality of third OLED pixels 121 arranged in an array. The driving mode of the third OLED pixels 121 may be an active driving mode or a passive driving mode. Optionally, when the driving mode of the third OLED pixels 121 is the active driving mode, a pixel circuit of the third OLED pixels 121 in the transparent display area may be a 1T pixel circuit, a 2T1C (two transistors and one capacitor) pixel circuit, a 3T1C (three transistors and one capacitor) pixel circuit, a 3T2C (three transistors and two capacitors) pixel circuit, a 4T1C (four transistors and one capacitor) pixel circuit, a 5T1C (five transistors and one capacitor) pixel circuit, a 6T1C (six transistors and one capacitor) pixel circuit, a 7T1C (seven transistors and one capacitor) pixel circuit, or a 7T2C (seven transistors and two capacitors) pixel circuit.

Optionally, a pixel density of the first OLED pixels 111 in the non-transparent display area 11 is greater than a pixel density of the third OLED pixels 121 in the transparent display area 12. In this way, a light transmittance of the transparent display area can be increased.

Optionally, a pixel density of the third OLED pixels 121 in the transparent display area 12 is the same as a pixel density of the second OLED pixels 131 in the transition display area 13.

Optionally, the transparent display area 12 may include the third OLED pixels 121 of a plurality of colors, and columns of pixels of different colors in one row form a pixel unit.

Optionally, all the third OLED pixels in the transparent display area may be pixels of a same color. Since all the third OLED pixels in the transparent display area are pixels of the same color, the manufacturing process can be simplified.

Optionally, the OLED array substrate includes a base, a first electrode layer disposed on the base, a light emitting structure layer disposed on the first electrode layer, and a second electrode layer disposed on the light emitting structure layer.

The first electrode layer located in the transparent display area includes a plurality of first electrode groups arranged along a first direction. Each of the first electrode groups includes a plurality of first electrodes, the first electrodes in a same first electrode group extend along a second direction. The second direction intersects with the first direction. Each of the first electrodes includes one first electrode block or a plurality of first electrode blocks. When each of the first electrodes includes the plurality of first electrode blocks, two adjacent first electrode blocks are electrically connected. The transparent display area includes a plurality of sub-display areas, at least one side of each of the sub-display areas is adjacent to the non-transparent display area or the transition display area. Each of the first electrodes is arranged only in one sub-display area. Different first electrodes are driven by different pixel circuits.

For the plurality of first electrodes included in the first electrode layer located in the transparent display area of the OLED array substrate, each first electrode is arranged only in one sub-display area, and different first electrodes are driven by different pixel circuits, so that sub-pixels corresponding to the first electrode in each sub-display area can be independently controlled, and then a data line input voltage of a pixel circuit corresponding to the first electrode in the sub-display area can be controlled according to the brightness of the non-transparent display area or transition display area adjacent to the sub-display area. Therefore, the display brightness of each sub-display area can be adjusted independently, so that the display brightness of each sub-display area is close to the brightness of its adjacent non-transparent display area or transition display area, and a difference in display brightness between the transparent display area and its adjacent non-transparent display area or transition display area is avoided being too large, thereby improving user experience.

Optionally, among the plurality of first electrodes in different first electrode groups, there is a gap between two adjacent first electrodes, and the two adjacent first electrodes are insulated from each other. Gaps between the plurality of first electrode groups are arranged in a staggered way in the first direction.

The gaps between the plurality of first electrode groups are arranged in a staggered way in the first direction, so that a boundary line between two adjacent sub-display areas is an irregular zigzag line. When the display brightness of different sub-display areas is different, this arrangement can weaken the perception of human eyes on the display brightness difference of adjacent sub-display areas, and improve the user experience. Moreover, the arrangement of the gaps between the plurality of first electrode groups in a staggered way in the first direction can also weaken the perception of human eyes on diffraction fringes generated when external light enters the first display areas, and is also beneficial to improve user experience.

Optionally, each of the first electrode groups includes two first electrodes, the transparent display area includes two sub-display areas, and the two first electrodes of each first electrode group are respectively arranged in the two sub-display areas.

In this way, a pixel circuit corresponding to the first electrode in each sub-display area can be arranged at a position in the non-transparent display area and adjacent to the sub-display area, or a position in the transition display area and adjacent to the sub-display area.

Optionally, the pixel circuit corresponding to the first electrode may be a 1T pixel circuit, a 2T1C pixel circuit, a 3T1C pixel circuit, a 3T2C pixel circuit, a 7T1C pixel circuit, or a 7T2C pixel circuit.

Optionally, a projection of the first electrode block on the base includes one first graphic unit or a plurality of connected first graphic units. The first graphic unit includes a circle shape, an ellipse shape, a dumbbell shape, a guard shape, or a rectangle shape. The above-mentioned shapes such as the circle shape, the ellipse shape, the dumbbell shape and the gourd shape can change a periodic structure which generates diffraction, that is, change the distribution of a diffraction field, so as to weaken the diffraction phenomenon, thereby ensuring that a picture taken by a camera below the transparent display area has a high definition.

Optionally, the light emitting structure layer includes a light emitting structure block correspondingly arranged on each of the first electrode blocks, and a projection of the light emitting structure block on the base includes one second graphic unit or a plurality of connected second graphic units. The second graphic unit is the same as or different from the first graphic unit. The second graphic unit includes a circle shape, an ellipse shape, a dumbbell shape, a gourd shape, or a rectangle shape. The above-mentioned shapes such as the circle shape, the ellipse shape, the dumbbell shape and the gourd shape can change a periodic structure which generates diffraction, that is, change the distribution of a diffraction field, so as to weaken the diffraction phenomenon, thereby ensuring that a picture taken by a camera below the transparent display area has a high definition.

Figure 13:
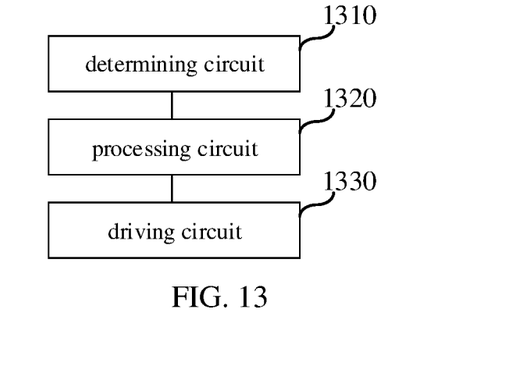
FIG. 13 is a schematic structural diagram illustrating a display panel according to the present application.

The present application also provides an apparatus of driving a display panel. The display panel includes a transparent display area and a non-transparent display area. The driving apparatus, as shown in FIG. 13, includes:

a determining circuit 1310 configured to determine a first type of picture data to be displayed in the non-transparent display area and a second type of picture data to be displayed in the transparent display area in picture data of a same frame of picture;

a processing circuit 1320 configured to perform a sub-pixel rendering operation on the first type of picture data to obtain first rendered picture data; and a driving circuit 1330 configured to drive the non-transparent display area according to the first rendered picture data, and to drive the transparent display area according to the second type of picture data.

The present application also provides a display device, including a display panel and the apparatus for driving a display panel according to any of the above embodiments.

Optionally, the display panel includes: an OLED array substrate and an encapsulation layer, where the encapsulation layer is encapsulated on a side of the OLED array substrate away from a base of the OLED array substrate, and a photosensitive element can be arranged below the transparent display area. Optionally, at least a part of the transparent display area is surrounded by the non-transparent display area. Optionally, the encapsulation layer includes a polarizer. The polarizer covers the non-transparent display area and does not cover the transparent display area. Optionally, the photosensitive element includes at least one of the following: a camera, a light sensor, or a light emitter.

In an embodiment, the display device may be any product or component with a display function, such as electronic paper, mobile phone, tablet computer, television, notebook computer, digital photo frame, and navigator.

In the drawings, the sizes of layers and areas may be exaggerated for clarity of illustration. Further, it is understood that when an element or layer is said to be "on" another element or layer, it may be directly on the other element or there may be an intermediate layer. In addition, it can be understood that when an element or layer is said to be "under" another element or layer, it may be directly under other elements, or there may be more than one intermediate layer or element. In addition, it can also be understood that when a layer or element is called "between" two layers or two elements, it may be the only layer between two layers or two elements, or there may be more than one intermediate layer or element. Similar reference numerals indicate similar elements throughout.

In this application, the terms "first" and "second" are only used for descriptive purposes, and cannot be understood as indicating or implying relative importance. The term "plurality" refers to two or more, unless specifically defined otherwise.

Other embodiments of the present application will be readily conceivable to a person skilled in the art upon consideration of the description and practice of the disclosure disclosed herein. The present application is intended to cover any variation, use or adaptive variation of the present application, and these variations, uses or adaptive variations follow the general principles of the present application and include common general knowledge or customary technical means in the technical field not disclosed in the present application. The description and examples are considered to be exemplary only, and the true scope and spirit of the present application are indicated by the following claims.

It should be understood that the present application is not limited to the precise structure that has been described above and shown in the drawings, and various modifications and changes can be made without departing from its scope. The scope of the present application is only limited by the appended claims.

The invention claimed is:

1. A method of driving a display panel, wherein the display panel comprises a transparent display area and a non-transparent display area and a plurality of pixels formed on the display panel,
   the display panel further comprises a transition display area, and the transition display area is located between the transparent display area and the non-transparent display area,
   the method comprising:
   determining a first type of picture data to be displayed in the non-transparent display area and a second type of picture data to be displayed in the transparent display area, in a plurality of picture data of a frame of picture;
   performing a sub-pixel rendering operation on the first type of picture data to obtain a plurality of first rendered picture data;
   driving the non-transparent display area according to the first rendered picture data; and
   driving the transparent display area according to the second type of picture data,
   wherein the plurality of pixels comprises a plurality of first OLED pixels arranged in array formed on the non-transparent display area, and a plurality of second OLED pixels arranged in array and formed on the transition display area, and an $m^{th}$ column of the second OLED pixels and a $2m-1^{th}$ column of the first OLED pixels share a same data line, wherein m is a natural number, wherein a pixel area of each of the second OLED pixels is N times a pixel area of each of the first OLED pixels, wherein N is a real number greater than or equal to 4, so that a position of a pixel row where one row of the second OLED pixels is located is substantially opposite to positions of pixel rows where two adjacent rows of the first OLED pixels are located, and a position of a pixel column where one column of the second OLED pixels is located is substantially opposite to positions of pixel columns where two columns of the first OLED pixels are located, a second pixel density of the plurality of second OLED pixels is less than a first pixel density of the plurality of first OLED pixels;

the second OLED pixels in a same row and one row of the first OLED pixels in adjacent M rows of the first OLED pixels share a same scanning line, two scanning lines of two adjacent rows of the second OLED pixels have at least one scanning line of the first OLED pixels disposed therebetween; the second OLED pixels in a same column and one column of the first OLED pixels in M columns of the first OLED pixels share a same data line, two data lines of two adjacent columns of the second OLED pixels have at least one data line of the first OLED pixels disposed therebetween, wherein M is a natural number.

2. The method of driving a display panel according to claim 1, wherein before driving the transparent display area according to the second type of picture data, the sub-pixel rendering operation is not performed on the second type of picture data.

3. The method of driving a display panel according to claim 1, wherein driving the transparent display area according to the second type of picture data comprises:
performing the sub-pixel rendering operation on the second type of picture data to obtain a plurality of second rendered picture data, and
driving the transparent display area according to the second rendered picture data.

4. The method of driving a display panel according to claim 1, wherein the method further comprises:
determining a third type of picture data to be displayed in the transition display area in the picture data; and
driving the transition display area according to the third type of picture data.

5. The method of driving a display panel according to claim 4, wherein before driving the transition display area according to the third type of picture data, the sub-pixel rendering operation is not performed on the third type of picture data.

6. The method of driving a display panel according to claim 4, wherein driving the transition display area according to the third type of picture data comprises:
performing the sub-pixel rendering operation on the third type of picture data to obtain a plurality of third rendered picture data;
driving the transition display area according to the third rendered picture data.

7. The method of driving a display panel according to claim 6, wherein in the sub-pixel rendering operation of the third type of picture data, grayscale values of every P pixels in a same row of a frame of a picture data are rendered to brightness values of each pixel of a same row in a frame of a display data, wherein P is a natural number equal or greater than 3, and there are no overlapped same pixels of the picture data for rendering different pixels of the display data.

8. The method of driving a display panel according to claim 1, wherein in the non-transparent display area, two adjacent rows of the first OLED pixels display corresponding two adjacent rows of the first rendered picture data, and two adjacent columns of the first OLED pixels display corresponding two adjacent columns of the first rendered picture data; and in the transition display area, two adjacent rows of the second OLED pixels display corresponding two rows of the third rendered picture data, and at least one row of the third rendered picture data between the two rows of the third rendered picture data is not displayed; two adjacent columns of the second OLED pixels display corresponding two columns of the third rendered picture data, and at least one column of the third rendered picture data between the two columns of the third rendered picture data is not displayed.

9. The method of driving a display panel according to claim 1, wherein

M is equal to 2, an $n^{th}$ row of the second OLED pixels and a $2n-1^{th}$ row of the first OLED pixels share a same scanning line, wherein n is a natural number; and the transition display area display the third rendered picture data of alternate rows and columns, so that a position of a pixel row where one row of the second OLED pixels is located is substantially opposite to positions of pixel rows where two adjacent rows of the first OLED pixels are located, and a position of a pixel column where one column of the second OLED pixels is located is substantially opposite to positions of pixel columns where two adjacent columns of the first OLED pixels are located, a pixel area of each of the second OLED pixels is larger than a pixel area of each of the first OLED pixels.

10. The method of driving a display panel according to claim 1, wherein each of the first OLED pixels comprises a plurality of sub-pixels of K colors, wherein K is a natural number;
each of the second OLED pixels comprises a plurality of sub-pixels of W colors, wherein W is a natural number;
when K is 3, each of the first OLED pixels comprises a red sub-pixel, a green sub-pixel, and a blue sub-pixel;
when W is 3, each of the second OLED pixels comprises a red sub-pixel, a green sub-pixel, and a blue sub-pixel;
wherein, in each of the first OLED pixels, the red sub-pixel, the green sub-pixel, and the blue sub-pixel of the first OLED pixel are arranged side by side or distributed in a triangle;
in each of the second OLED pixels, the red sub-pixel, the green sub-pixel, and the blue sub-pixel of the second OLED pixel are arranged side by side or distributed in a triangle.

11. The method of driving a display panel according to claim 1, wherein, the transparent display area has any of the following shapes: rectangle, diamond, water drop, circle, ellipse, semicircle, or semiellipse; and when the transparent display area has a rectangle shape, a length of the transparent display area is 3 mm, and a width of the transparent display area is 3 mm.

12. The method of driving a display panel according to claim 1, wherein the plurality of pixels comprises a plurality of third OLED pixels arranged in array and formed on the transparent display area, and a driving mode of the third OLED pixels is an active driving mode or a passive driving mode;

when the driving mode of the third OLED pixels is the active driving mode, a pixel circuit of the third OLED pixels in the transparent display area is a pixel circuit consisting of one transistor, a pixel circuit consisting of two transistors and one capacitor, a pixel circuit consisting of three transistors and one capacitor, a pixel circuit consisting of three transistors and two capacitors, a pixel circuit consisting of four transistors and one capacitor, a pixel circuit consisting of five transistors and one capacitor, a pixel circuit consisting of six transistors and one capacitor, a pixel circuit consisting of seven transistors and one capacitor, or a pixel circuit consisting of seven transistors and two capacitors; and a pixel density of the first OLED pixels in the non-transparent display area is greater than a pixel density of the third OLED pixels in the transparent display area.

13. The method of driving a display panel according to claim 12, wherein the transparent display area has the third OLED pixels of a plurality of colors formed thereon, and the third OLED pixels of different colors in one row form a pixel unit; or all of the third OLED pixels in the transparent display area are pixels of a same color; and the pixel density of the third OLED pixels in the transparent display area is the same as a pixel density of the second OLED pixels in the transition display area.

14. The method of driving a display panel according to claim 1, wherein determining the first type of picture data to be displayed in the non-transparent display area and the second type of picture data to be displayed in the transparent display area in the plurality of picture data of the frame of picture comprises:

determining respective display positions of a plurality of sub-picture data of the pixels according to a receiving sequence of the sub-picture data of the pixels in the picture data and a correspondence between the receiving sequence and the display positions;

determining the sub-picture data of the plurality of sub-picture data, whose display positions are located in the non-transparent display area as the first type of picture data; and determining the sub-picture data of plurality of sub-picture data, whose display positions are located in the transparent display area as the second type of picture data, wherein the picture data of the frame of picture comprises the sub-picture data of a plurality of rows of pixels, and the display panel receives the sub-picture data of one row of pixels at a time, and sub-picture data of each row of pixels drives one row of pixels at a specified position on the display panel to display.

15. The method of driving a display panel according to claim 1, wherein the display panel comprises an OLED array substrate and an encapsulation layer;

the OLED array substrate comprises a base, a first electrode layer disposed on the base, a light emitting structure layer disposed on the first electrode layer, and a second electrode layer disposed on the light emitting structure layer;

the encapsulation layer is encapsulated on a side of the OLED array substrate away from the base of the OLED array substrate;

the first electrode layer located in the transparent display area comprises a plurality of first electrode groups arranged along a first direction, each of the first electrode groups comprises a plurality of first electrodes, the first electrodes in a same first electrode group extend along a second direction, and the second direction intersects with the first direction; each of the first electrodes comprises one first electrode block or a plurality of first electrode blocks, and when each of the first electrodes includes the plurality of first electrode blocks, two adjacent ones of the first electrode blocks are electrically connected;

the transparent display area comprises a plurality of sub-display areas, at least one side of each of the sub-display areas is adjacent to the non-transparent display area, each of the first electrodes is arranged only in one sub-display area, and different ones of the first electrodes are driven by different pixel circuits, and among a plurality of first electrodes in different first electrode groups, there is a gap between two adjacent first electrodes, the two adjacent first electrodes are insulated, and gaps between the plurality of first electrode groups are arranged in a staggered way in the first direction.

16. The method of driving a display panel according to claim 15, wherein each of the first electrode groups comprises two first electrodes, the transparent display area comprises two sub-display areas, and the two first electrodes of each of the first electrode groups are respectively arranged in the two sub-display areas;

a pixel circuit corresponding to the first electrodes is a pixel circuit consisting of a transistor, a pixel circuit consisting of two transistors and one capacitor, a pixel circuit consisting of three transistors and one capacitor, a pixel circuit consisting of three transistors and two capacitors, a pixel circuit consisting of seven transistors and one capacitor, or a pixel circuit consisting of seven transistors and two capacitors;

a projection of the first electrode block on the base comprises one first graphic unit or a plurality of connected first graphic units; and the light emitting structure layer comprises a plurality of light emitting structure blocks, each light emitting structure block is correspondingly arranged on one of the first electrode blocks, a projection of each of the light emitting structure blocks on the base comprises one second graphic unit or a plurality of connected second graphic units, and the second graphic unit is the same as or different from the first graphic unit.

17. The method of driving a display panel according to claim 1, wherein a position of a pixel row where one row of the second OLED pixels is located may be substantially opposite to positions of pixel rows where two adjacent rows of the first OLED pixels are located, and a position of a pixel column where one column of the second OLED pixels is located may be substantially opposite to positions of pixel columns where two adjacent columns of the first OLED pixels are located.

18. An apparatus for driving a display panel, wherein the display panel comprises a transparent display area and a non-transparent display area and a plurality of pixels, the display panel further comprises a transition display area, and the transition display area is located between the transparent display area and the non-transparent display area, the apparatus comprising:
a determining circuit configured to determine a first type of picture data to be displayed in the non-transparent display area and a second type of picture data to be displayed in the transparent display area, in a plurality of picture data of a frame of picture;
a processing circuit configured to perform a sub-pixel rendering operation on the first type of picture data to obtain a plurality of first rendered picture data; and
a driving circuit configured to drive the non-transparent display area according to the first rendered picture data, and to drive the transparent display area according to the second type of picture data,
wherein the plurality of pixels comprises a plurality of first OLED pixels arranged in array formed on the non-transparent display area, and a plurality of second OLED pixels arranged in array and formed on the transition display area, and
an $m^{th}$ column of the second OLED pixels and a $2m-1^{th}$ column of the first OLED pixels share a same data line, wherein m is a natural number,
wherein a pixel area of each of the second OLED pixels is N times a pixel area of each of the first OLED pixels, wherein N is a real number greater than or equal to 4, so that a position of a pixel row where one row of the second OLED pixels is located is substantially opposite to positions of pixel rows where two adjacent rows of the first OLED pixels are located, and a position of a pixel column where one column of the second OLED pixels is located is substantially opposite to positions of pixel columns where two columns of the first OLED pixels are located,
a second pixel density of the plurality of second OLED pixels is less than a first pixel density of the plurality of first OLED pixels;
the second OLED pixels in a same row and one row of the first OLED pixels in adjacent M rows of the first OLED pixels share a same scanning line, two scanning lines of two adjacent rows of the second OLED pixels have at least one scanning line of the first OLED pixels disposed therebetween; the second OLED pixels in a same column and one column of the first OLED pixels in M columns of the first OLED pixels share a same data line, two data lines of two adjacent columns of the second OLED pixels have at least one data line of the first OLED pixels disposed therebetween, wherein M is a natural number.

19. A display device, comprising a display panel and an apparatus for driving a display panel according to claim 18, wherein
the display panel comprises a transparent display area and a non-transparent display area;
the display panel comprises an OLED array substrate and an encapsulation layer, the encapsulation layer is encapsulated on a side of the OLED array substrate away from a base of the OLED array substrate, and a photosensitive element is arranged below the transparent display area;
at least a part of the transparent display area is surrounded by the non-transparent display area;
the encapsulation layer comprises a polarizer, and the polarizer covers the non-transparent display area and does not cover the transparent display area; and
the photosensitive element comprises at least one of the following: a camera, a light sensor, or a light emitter.

* * * * *